(12) United States Patent
Yuzawa

(10) Patent No.: US 6,731,511 B2
(45) Date of Patent: May 4, 2004

(54) WIRING BOARD, METHOD OF MANUFACTURING THE SAME, ELECTRONIC COMPONENT, AND ELECTRONIC INSTRUMENT

(75) Inventor: Hideki Yuzawa, Iida (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/359,014

(22) Filed: Feb. 4, 2003

(65) Prior Publication Data

US 2003/0161120 A1 Aug. 28, 2003

(30) Foreign Application Priority Data

Feb. 28, 2002 (JP) ........................................ 2002-053615

(51) Int. Cl.⁷ .............................. H05K 7/02; H05K 7/06; H05K 7/08
(52) U.S. Cl. ...................... 361/760; 361/803; 361/720; 361/748; 257/784; 174/52.4; 174/261
(58) Field of Search ................................ 361/760, 720, 361/736, 777, 748, 767, 820, 808, 764, 772; 257/784, 648; 174/250, 256, 260, 261, 52.4

(56) References Cited

U.S. PATENT DOCUMENTS

| 4,942,452 A | * | 7/1990 | Kitano et al. ................ 257/666 |
| 6,169,253 B1 | * | 1/2001 | Jairazbhoy et al. ......... 174/250 |
| 6,441,316 B1 | * | 8/2002 | Kusui ......................... 174/260 |

* cited by examiner

Primary Examiner—David Martin
Assistant Examiner—Hung Bui
(74) Attorney, Agent, or Firm—Hogan & Hartson, LLP

(57) ABSTRACT

A wiring board includes a wiring pattern having a lands and a line connected to the land, a substrate supporting the wiring pattern, and a protective film provided over the substrate and having an opening. The land has a first portion which includes a connecting portion connected to the line and is covered by the protective film, and a second portion exposed by the opening. A hole for exposing the substrate is formed at least in the first portion of the land.

14 Claims, 6 Drawing Sheets

WIRING BOARD, METHOD OF MANUFACTURING THE SAME, ELECTRONIC COMPONENT, AND ELECTRONIC INSTRUMENT

Japanese Patent Application No. 2002-53615, filed on Feb. 28, 2002, is hereby incorporated by reference in its entirety.

BACKGROUND OF THE INVENTION

The present invention relates to a wiring board and method of manufacturing the wiring board, to an electronic component and to an electronic instrument.

Chip On Film (COF) is a known mounting method, in which a semiconductor chip is mounted on a tape. Wiring patterns are formed on the tape, and also a protective film (for example, a solder resist) is formed covering the wiring patterns. The terminals of the wiring patterns are formed as lands, which are wider than lines. Then the protective film covers and protects the lines and the connections with the lines in the lands, and has an opening for exposing part of the lands except the connections. That is to say, at least part of an end portion of the protective film (having an opening) is provided over the lands.

However, since the adhesion between the protective film (insulating material) and the lands (metal) is weak, the two tend to peel apart. In particular, after the protective film is formed, if plating is applied to the exposed portions of the lands, then plating fluid seeping into the boundary between the protective film and the land may cause the protective film to peel off. If the protective film peels off, the exposed wiring patterns induce electro migration or oxidation, and the reliability of the semiconductor device is impaired.

BRIEF SUMMARY OF THE INVENTION

According to a first aspect of the present invention, there is provided a wiring board comprising:

a substrate;

a wiring pattern which is provided on the substrate and includes a land and a line connected to the land; and a protective film which has an opening and is provided over the substrate and the wiring pattern, wherein:

the land havs a first portion which includes a connecting portion connected to the line and is covered by the protective film, and a second portion exposed by the opening; and a hole is formed at least in the first portion of the land, to expose the substrate.

According to a second aspect of the present invention, there is provided an electronic component comprising:

the above-described wiring board; and an electronic element having a terminal electrically connected to the second portion of the land, and mounted on the wiring board.

According to a third aspect of the present invention, there is provided an electronic instrument comprising the above-described electronic component.

According to a fourth aspect of the present invention, there is provided a method of manufacturing a wiring board, comprising:

forming on a substrate a wiring pattern which has a land and a line connected to the land;

forming a hole in the land for exposing the substrate; and forming a protective film having an opening to provide on the land a first portion covered by the protective film and including a connecting portion connected to the line and at least part of a portion having the hole, and a second portion exposed by the opening.

DETAILED DESCRIPTION OF THE EMBODIMENT

Figure 1A:
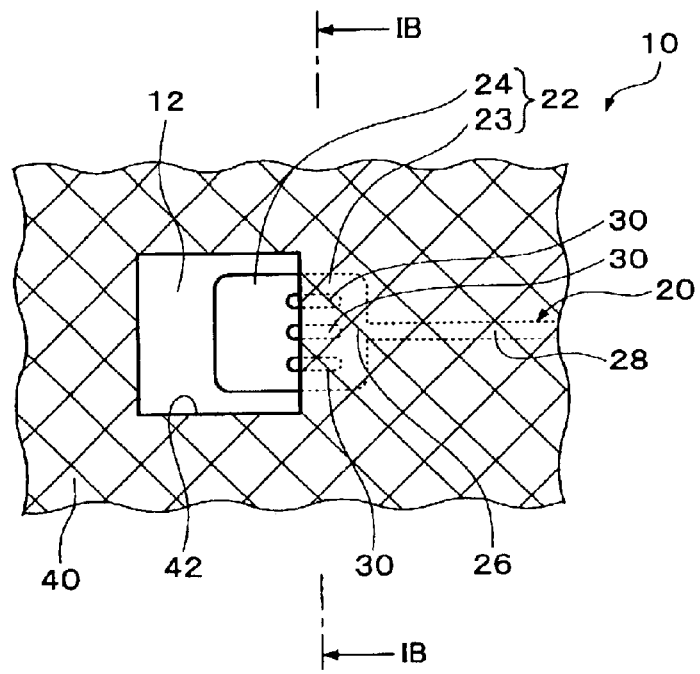
FIGS. 1A and 1B illustrate a wiring board according to one embodiment of the present invention.

Embodiments of the present invention enables to prevent breaking of a wiring pattern and peeling off of the protective film from the substrate.

(1) According to one embodiment of the present invention, there is provided a wiring board comprising:

a substrate;

a wiring pattern which is provided on the substrate and includes a land and a line connected to the land; and a protective film which has an opening and is provided over the substrate and the wiring pattern, wherein:

the land has a first portion which includes a connecting portion connected to the line and is covered by the protective film, and a second portion exposed by the opening; and a hole is formed at least in the first portion of the land, to expose the substrate.

In this embodiment of the present invention, a hole is formed in the first portion of the land covered by the protective film to expose the substrate. Since the material of the protective film is closely contact with the substrate within the region of the land, the adhesion force of the protective film and substrate is improved. Therefore, peeling off of the protective film from the land can be prevented on the substrate.

Furthermore, since the protective film covers at least the connection of the land with the line, line breakage of the wiring patterns due to thermal stress and the like can be prevented.

(2) In this wiring board, at least part of an end portion of the protective film may be located over the land; and the width of the land, at least in a portion over which the end portion of the protective film is located, may be larger than the width of the line at the connecting portion connected to the land.

(3) In this wiring board, the hole may be formed only in the first portion.

In this configuration, no hole is formed in the second portion to expose the substrate. The second portion is a region used as a terminal. Therefore, a bonding region can be made larger. For example, the region for providing a soldering or brazing material can be made larger.

(4) In this wiring board, the hole may be formed in the first and second portions.

In this configuration, a hole exposing the substrate is also formed in the second portion. Therefore, migration of a plating fluid provided in the second portion to the first portion can be prevented by the hole, for example.

(5) In this wiring board, the hole may be formed continuously from the first portion to the second portion.

(6) In this wiring board, the hole may be a slit extending toward the second portion.

(7) In this wiring board, a plurality of the holes may be formed.

Since this configuration enables the material of the protective film to have a grip on the surface relief of the land, peeling off-of the protective film from the substrate can be even more effectively prevented.

(8) In this wiring board, the holes may be arranged in a direction parallel to a boundary between the first and second portions.

(9) In this wiring board, a metal coating may be formed on the second portion by plating.

Since plating fluid is made less likely to migrate to the first portion, peeling off of the protective film from the substrate can be prevented.

(10) In this wiring board, the wiring pattern maybe formed of at least copper; and the metal coating may be formed of gold.

(11) In this wiring board, the substrate maybe a flexible substrate.

(12) According to one embodiment of the present invention, there is provided an electronic component comprising:

the above-described wiring board; and an electronic element having a terminal electrically connected to the second portion of the land, and mounted on the wiring board.

(13) In this electronic component, the electronic element may be a semiconductor chip; and the semiconductor chip may have a bump as the terminal.

(14) According to one embodiment of the present invention, there is provided an electronic instrument comprising the above-described electronic component.

(15) According to one embodiment of the present invention, there is provided a method of manufacturing a wiring board, comprising:

forming on a substrate a wiring pattern which has a land and a line connected to the land;

forming a hole in the land for exposing the substrate; and forming a protective film having an opening to provide on the land a first portion covered by the protective film and including a connecting portion connected to the line and at least part of a portion having the hole, and a second portion exposed by the opening.

In this embodiment of the present invention, a hole is formed in the first portion of the land to expose the substrate. Since the material of the protective film is closely contact with the substrate within the region of the land, the adhesion force of the protective film and substrate is improved. Therefore, peeling off of the protective film on the substrate can be prevented. As a result of this, the plating fluid can be prevented from migrating to the first portion when plating is carried out in a subsequent process, for example.

Furthermore, since the protective film covers at least the connection of the land with the line, line breakage of the wiring patterns due to thermal stress and the like can be prevented when heat treatment is carried out in a subsequent process, for example.

(16) In this method of manufacturing a wiring board, the hole may be formed by providing a resist having an opening on a conductive film which becomes the wiring pattern, and by etching a portion of the conductive film exposed by the opening of the resist, using the resist as a mask.

By means of this, the hole can be formed simply.

(17) In this method of manufacturing a wiring board, the step of forming the hole may be carried out simultaneously with the step of forming the wiring pattern.

By means of this, manufacture in a reduced number of steps is possible.

(18) In this method of manufacturing a wiring board, plating may be applied to the second portion of the land after the step of forming the protective film.

One embodiment of the present invention will be described below with reference to the drawings. Note that the present invention is not limited to this embodiment.

Wiring Board

Figure 1B:
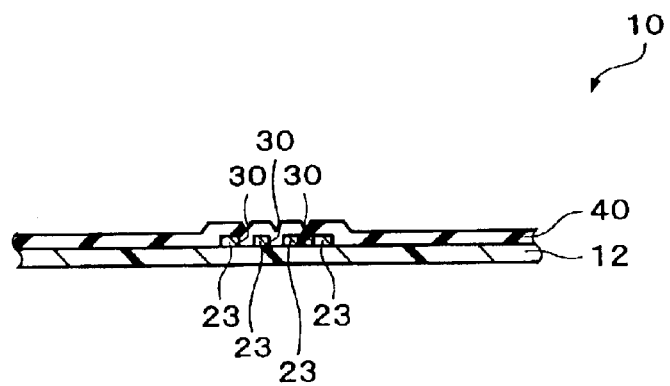
Figure 2:
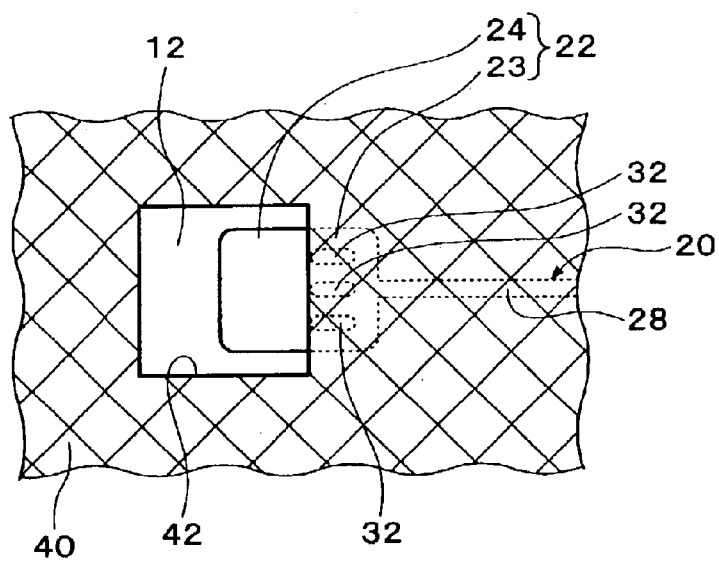
FIG. 2 illustrates a wiring board according to a modification of this embodiment.
Figure 3:
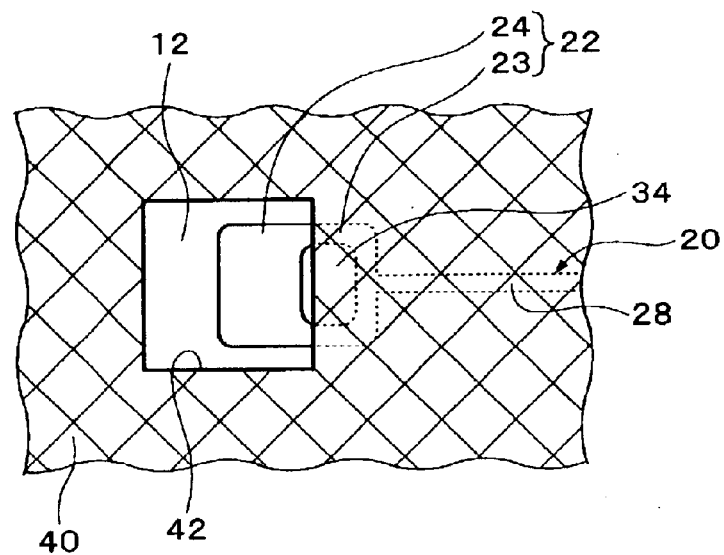
FIG. 3 illustrates a wiring board according to a modification of this embodiment.
Figure 4:
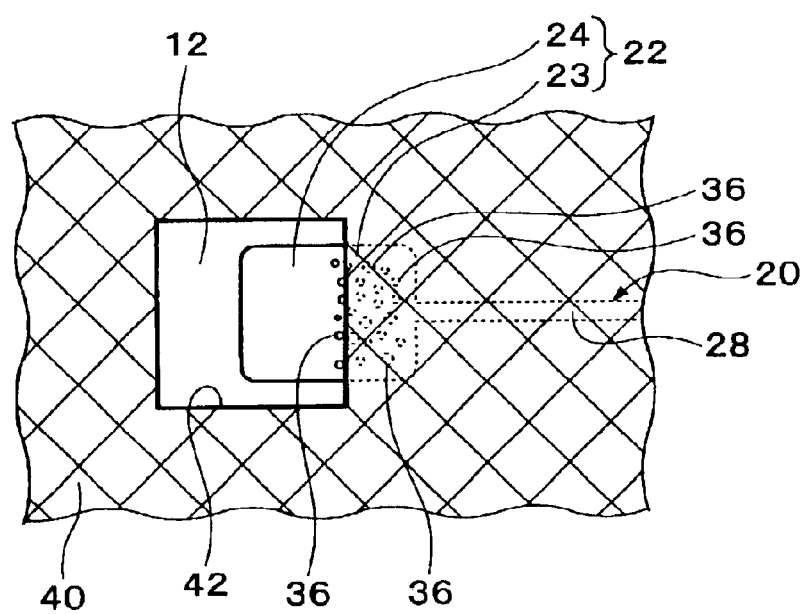
FIG. 4 illustrates a wiring board according to a modification of this embodiment.

FIGS. 1A to 4 illustrate the wiring board according to this embodiment. FIG. 1A is partial enlarged view of the wiring board, and FIG. 1B is a sectional view along the line IB—IB in FIG. 1A. It should be noted that FIGS. 2 to 4 show modifications of this embodiment. A wiring board (or circuit board) 10 includes a substrate 12, wiring patterns 20, and a protective film 40.

The substrate 12 may be organic (for example, an epoxy substrate), inorganic (for example, a ceramic substrate or glass substrate) or a composite construction thereof (for example, a glass epoxy substrate), and thus the material is not limited. In the example shown in FIGS. 1A and 1B, the substrate 12 is a flexible substrate. As a flexible substrate may be cited, for example, a polyester substrate or polyimide substrate or the like. The substrate 12 may be a substrate for Chip On Film (COF) or a substrate for Tape Automated Bonding (TAB).

On the substrate 12, a plurality of wiring patterns 20 is formed. That is to say, the wiring patterns 20 are supported by the substrate 12. The wiring patterns 20, as shown in FIG. 1B, may be formed on one surface of the substrate 12, or may be formed on both surfaces. The wiring patterns 20 refer to portions which provide electrical connection between at least two points, and a plurality of independently formed wiring patterns 20 may be referred to as an interconnecting pattern. The wiring patterns 20 maybe formed of a single layer (for example, a copper layer), or of multiple layers (for example, a copper layer and a nickel layer or the like).

The wiring patterns 20 comprises lands (pads) 22 and lines 28 connecting to the lands 22. The lands 22 are terminals to provide electrical connection to an electronic element, and the lines 28 are signal lines, supplying signals to the lands 22. It should be noted that in the example shown in FIG. 1A, the lands 22 are terminals for surface mounting. As a modification, the lands 22 may be terminals for insertion mounting having through holes (not shown in the drawings).

The lands 22 may have a polygon form such as a triangular form, rectangular form, or the like (or a form with rounded corners), or may be of circular form. In the example shown in FIG. 1A, the lands 22 have a rectangular form (more specifically, an oblong form). Then the lines 28 are connected to the extremities of the lands 22. The lines 28 may be connected to intermediate portions of the edges of the lands 22 (in FIG. 1A, to central portions of the edges), or may be connected to corners of the lands 22.

A single land 22 often has a single line 28 connected, but a single land 22 may have a plurality of lines 28 connected. Alternatively, a single line 28 may split into a number of branches, and these branches (not shown in the drawings) may be connected to a single land 22. Alternatively, the lines 28 may have reinforcing portions (not shown in the drawings) wider than other portions, and these reinforcing portions and the lands 22 may be connected. By means of this, line breakage between the lands 22 and lines 28 can be prevented.

The width of the lands 22 is more than the width of the lines 28. In terms of the example shown in FIG. 1A, of the extremity (opening extremity) of the protective film 40 at least a part is provided over the land 22, and the width of the lands 22 at least in the portion where the extremity of the protective film 40 is provided may have a greater width than the width of the line 28 at the connection between the land 22 and line 28. Here, the width of the lines 28 refers to the dimension in the direction orthogonal to the direction of extension of the lines 28, and the width of the lands 22 refers to the dimension in the same direction as that of the width of the lines 28. By providing the lands 22, the lines 28 can be made finer. Therefore, the freedom of layout of the wiring patterns 20 on the substrate 12 can be improved.

The protective film 40 is formed of an insulating material (for example, resin). The protective film 40 has an opening 42. The opening 42 exposes a part of the lands 22 (more specifically, a second portion 24). The opening 42 may expose a second portion 24 of a single land 22, or may expose the second portions 24 of a plurality of lands 22. In the example shown in FIG. 1A, the opening 42 also exposes a portion of the substrate 12. The protective film 40 preferably covers the lines 28. By virtue of this, line breakage of the lines 28 can be prevented. The protective film 40 is provided on the substrate 10 excluding the opening 42. In this embodiment, the protective film 40 is a solder resist for selectively providing a soldering or brazing material. The protective film 40 remains on the wiring board 10 as a final product (semiconductor device), and therefore it is preferable to select a material of the desired heat resistance and such like properties.

The land 22 comprises first and second portions 23 and 24. The first portion 23 includes a portion 26 of the land 22 connecting with the line 28. That is to say, the first portion 23 is the basal end of the land 22 on the side of the line 28. The first portion 23 is covered by the protective film 40. The second portion 24 is the remaining portion excluding the first portion 23. That is to say, the second portion 24 is the distal extremity of the land 22. The second portion 24 is exposed by the opening 42 in the protective film 40.

The size (area or length) of the first portion 23 may be approximately the same as the size of the second portion 24. Alternatively, the size of the first portion 23 may be larger than the size of the second portion 24. By means of this, since the region in which the land 22 is covered by the protective film 40 can be increased, peeling off of the land 22 can be prevented, while also line breakage of the wiring pattern 20 can be prevented. Alternatively, the size of the first portion 23 may be smaller than the size of the second portion 24. By means of this, since the exposed region of the land 22 can be made larger, as described below, the size of the bonding region for a semiconductor chip 50 to be mounted on the substrate 12, or electronic element terminal can be made larger. For example, a soldering or brazing material can be provided satisfactorily.

In the land 22, one or a plurality of holes 30 are formed. The holes 30 are through holes, exposing the substrate 12. The holes 30 are formed in at least the first portion 23 of the land 22.

In the example shown in FIG. 1A, multiple (for example, three) holes 30 are formed. The plurality of holes 30 may be formed in the first and second portions 23 and 24. By virtue of this, for example, when plating is carried out on the second portion 24, migration of the plating fluid from the second portion 24 to the first portion 23 can be prevented by the holes 30. For the opening area (or number) of the holes 30, it is preferable for the first portion 23 to be larger (or more numerous) than the second portion 24. By virtue of this, the region of providing a soldering or brazing material in the second portion 24 can be made larger.

The holes 30 may communicate from the first portion 23 to the second portion 24. In other words, the holes 30 may be formed as continuous openings from the first portion 23 to the second portion 24. The holes 30 may extend in the direction of the second portion 24, that is to say, may be slits (or slots) having a direction of elongation of the holes 30 in the direction orthogonal to the boundary between the first and second portions 23 and 24. By virtue of this, a hole spanning the first and second portions 23 and 24 can be formed simply. Then as shown in FIGS. 1A and 1B, a plurality of the holes 30 may be disposed along the direction parallel to the boundary between the first and second portions 23 and 24. Alternatively, a plurality of holes 30 maybe disposed a long the direction orthogonal to the boundary between the first and second portions 23 and 24. It should be noted that the form of the holes 30 is not limited to the example given above.

Figure 5:
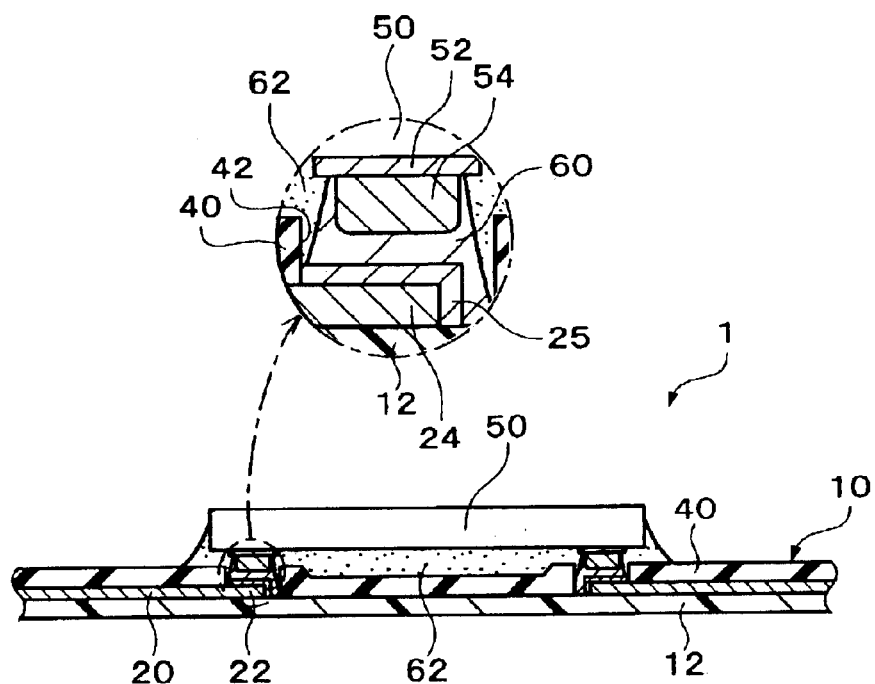
FIG. 5 shows a semiconductor device according to this embodiment of the invention.

On the second portion 24 of the land 22, a metal coating 25 may be formed (see FIG. 5). The metal coating 25 is formed by plating. In this embodiment, since the holes 30 are formed in the lands 22, the plating fluid does not migrate to the first portion 23, or becomes less likely to migrate. That is to say, seeping of the plating fluid between the protective film 40 and the lands 22 can be prevented. Therefore, peeling off of the protective film 40 from the substrate 12 and lands 22 can be prevented. For example, when the material of the wiring patterns 20 includes at least copper, the metal coating 25 may be formed of gold. Gold is easily wetted by a soldering or brazing material. Therefore, brazing bonding between the wiring patterns 20 and other electronic elements can be achieved satisfactorily.

According to this embodiment, in the first portion 23 of the land 22 covered by the protective film 40, the holes 30 exposing the substrate 12 are formed. By means of this, as shown in FIG. 1B, within the region of the land 22, since the material of the protective film 40 is in intimate contact with the substrate 12, the adhesion force between the protective film 40 and the substrate 12 is improved. Therefore, peeling off of the protective film 40 on the substrate 12 can be prevented. Furthermore, since the protective film 40 covers at least the portion 26 of the land 22 connecting with the line 28, line breakage of the wiring patterns 20 due to thermal stress and the like can be prevented. By forming a plurality of holes 30, since as shown in FIG. 1B the material of the protective film 40 has a grip on the surface relief of the lands 22, peeling off of the protective film 40 from the substrate 12 can be even more effectively prevented.

The present invention is not limited to the above described example, and as shown below various modifications are possible. It should be noted that in the following modifications, the features described above can as far as possible be applied.

As shown in FIG. 2, holes 32 may be formed only in the first portion 23. In this case, a portion of the holes 32 is preferably provided in a position close to the boundary of the first and second portions 23 and 24 (for example, in a substantially adjacent position). By virtue of this, migration of the plating fluid from the second portion 24 to the first portion 23 can be prevented, and also the region for providing a soldering or brazing material to the second portion 24 can be made larger. By means of this, the holes 32 exposing the substrate 12 are not formed in the second portion 24. The second portion 24 is a region used as a terminal. Therefore, the region for providing a soldering or brazing material can be made larger. It should be noted that other aspects of the construction of the holes 32 are as described above for the holes 30.

As shown in FIG. 3, in a single land 22, a single hole 34 may be formed. In the example shown in FIG. 3, the hole 34 is formed in the first and second portions 23 and 24 (for example, continuously), but may be formed only in the first portion 23. The form of the opening of the holes 30 may be an angular form such as a triangular form, rectangular form, polygonal form, or the like, or a circular form or the like, and for example may be a shape similar to the shape of the land 22.

As shown in FIG. 4, a single land 22 may have a plurality of holes 36 formed in a concentration. The plurality of holes 36 is formed in a mesh form. The holes 36 are small holes, of a size such as to be filled by the material of the protective film 40. In the example shown in FIG. 4, the holes 36 are formed in the first and second portions 23 and 24, but may be formed only in the first portion 23. The holes 36 may be circular holes of circular form, but this shape is not significant.

It should be noted that in these modifications also, the above described effect can be achieved.

Semiconductor Device

FIG. 5 illustrates a semiconductor device according to this embodiment. A semiconductor device 1 comprises a wiring board 10 and a semiconductor chip 50. Furthermore, there may be comprised, between the terminals thereof a soldering or brazing material 60.

The semiconductor chip 50 has a plurality of pads 52. The pads 52 are commonly formed on the surface on which an integrated circuit is formed. The pads 52 are commonly formed of a metal including aluminum or including copper. On each pad 52 is commonly formed a bump 54. The bump 54 is commonly a gold bump. Gold is easily wetted by the soldering or brazing material 60. Therefore, soldering or brazing bonding between the bumps 54 and lands 22 can be achieved satisfactorily. The bonding between the bumps 54 and lands 22 is not limited to bonding by a soldering or brazing material, and other general purpose bonding methods such as metal bonding, adhesive bonding, or the like can be applied.

The semiconductor chip 50 is subjected to face-down bonding on the wiring board 10. In the example shown in FIG. 5, the bumps 54 and lands 22 (more specifically, the second portion 24) are electrically connected by brazing bonding.

A resin 62 may be provided between the semiconductor chip 50 and the wiring board 10. The resin 62 may, for example, be of an epoxy based material. When the semiconductor chip 50 is subjected to face-down bonding on the wiring board 10, the resin 62 is referred to as an underfill material. The resin 62 may be of a different material from the protective film 40, or may be of the same material.

In the above description, the example shown is of the semiconductor chip 50 mounted on one surface of the wiring board 10, but the present invention includes the possibility that semiconductor chips 50 are mounted on both surfaces of the wiring board 10. In this case, wiring patterns 20 and the protective film 40 may be formed on both surfaces of the wiring board 10.

It should be noted that in place of the above described semiconductor chip, an electronic element (active element or passive element) may be subjected to surface mounting on the wiring board 10, to form an electronic component. More specifically, the electronic element may have one or a plurality of terminals, and the terminal(s) and lands 22 may be bonded by a bonding method such as brazing bonding or the like. In this case, the terminals are preferably bumps. The electronic element may be, for example, a resistor, capacitor, optical element, or the like.

Method of Manufacture of a Wiring Board

FIGS. 6A to 6D show the method of manufacture of a wiring board according to this embodiment. In this embodiment, the substrate 12 has formed wiring patterns 20, holes 30, and protective film 40. In the example shown in FIGS. 6A to 6D, the wiring patterns 20 and holes 30 are formed simultaneously.

The wiring board 10 may be manufactured using reel-to-reel transport. In this case, the substrate 12 is a flexible substrate. The substrate 12 is thus in tape form, so that a plurality of electrically isolated interconnecting patterns can be formed. By means of this, the manufacturing process is adaptable to assembly-line production, as a result of which the production efficiency can be improved, and manufacturing cost reduced.

Figure 6A:
FIGS. 6A to 6D show a method of manufacturing a wiring board according to this embodiment of the invention.

As shown in FIG. 6A, a conductive film 14 of the material to form the wiring patterns 20 is provided on the substrate 12. In this case, the conductive film 14 may be applied to the substrate 12 with an adhesive material (not shown in the drawings) interposed, to form a three-layer substrate. In this case, as described in this embodiment, after applying photolithography, etching may be used to form the wiring patterns 20. As a modification, the conductive film 14 may be formed on the substrate 12 with no adhesive, to constitute a two-layer substrate. For example, the wiring patterns 20 may be formed by sputtering or the like, or an additive method may be adopted, in which the wiring patterns 20 are formed by electroless plating.

Figure 6B:
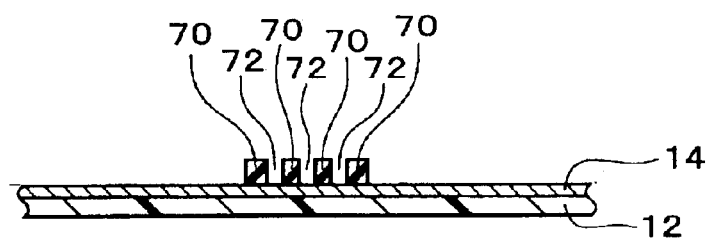

As shown in FIG. 6B, a photosensitive resist 70 (which may be either positive or negative) is formed on the conductive film 14. After disposing the resist 70 over the whole of the conductive film 14, particular steps (exposure, development, and the like) are carried out, for selective patterning. More specifically, the resist 70 is left remaining in the regions to form the wiring patterns 20. In this case, in order to form the wiring patterns 20 and the holes 30 in the lands 22 simultaneously, openings 72 in the resist 70 are positioned in the regions to form the holes 30. As a modification, after patterning the wiring patterns 20, resist for forming the holes 30 may be provided over the wiring patterns 20.

Figure 6C:
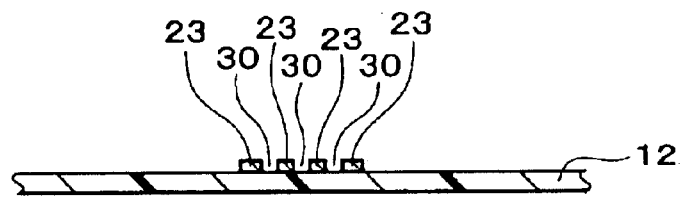

As shown in FIG. 6C, the regions exposed by the resist 70 are etched. That is to say, using the resist 70 as a mask, the wiring patterns 20 and the holes 30 in the lands 22 (more specifically, the first portions 23) are formed simultaneously.

Figure 6D:
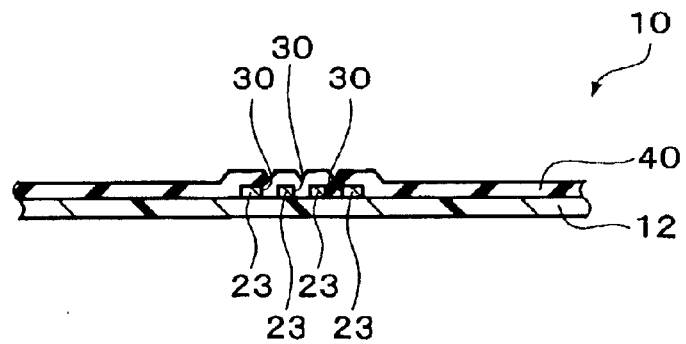

As shown in FIG. 6D, the protective film 40 is formed. In the step of patterning the protective film 40 (the step of forming the opening 42), photolithography may be applied for the forming, or a printing or ink jet method may be applied.

Thereafter, plating may be carried out on the first portions 23 of the lands 22. For example, the wiring board 10 is immersed in a plating bath, and on the first portion 23 exposed by the opening 42 in the protective film 40 a metal coating 25 is formed. The plating may be electroplating, or may equally be electroless plating.

According to this embodiment, the holes 30 are formed in the first portions 23 of the lands 22, exposing the substrate 12. By means of this, as shown in FIG. 6D, within the region of the lands 22, the material of the protective film 40 makes intimate contact with the substrate 12, as a result of which the adhesion force between the protective film 40 and the substrate 12 is improved. Therefore, peeling off of the protective film 40 from the substrate 12 can be prevented.

It should be noted that this embodiment of the method of manufacture of a semiconductor device includes the above described method of manufacture of a wiring board, and mounting a semiconductor chip 50 on the wiring board 10. On the wiring board 10, one or a plurality of semiconductor chips 50 is or are mounted. In more detail, the description of the above described semiconductor device applies.

Electronic Instrument

Figure 7:
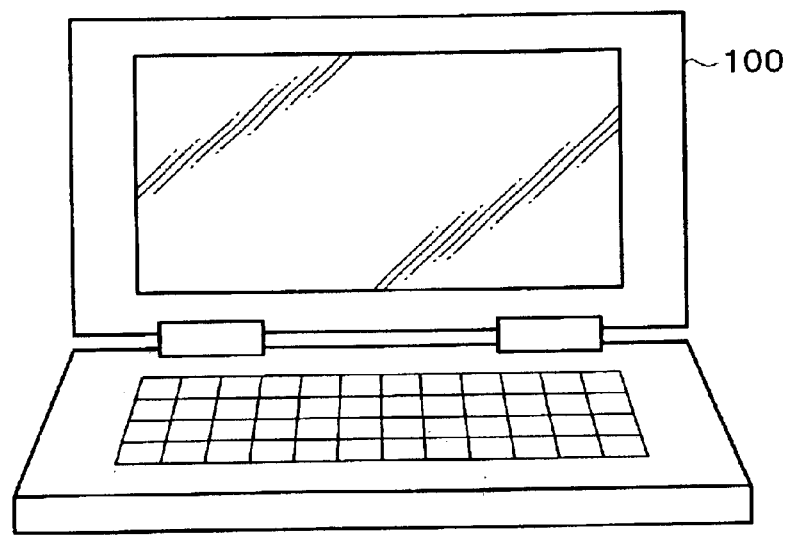
FIG. 7 shows an electronic instrument according to this embodiment.
Figure 8:
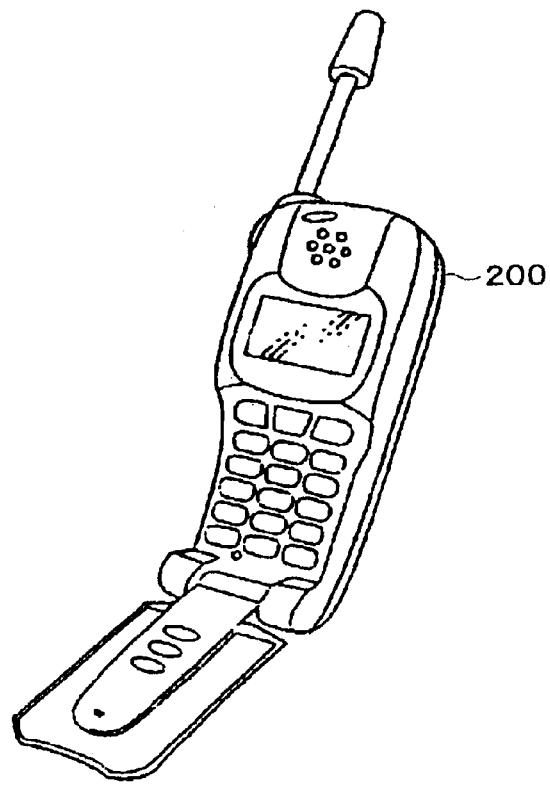
FIG. 8 shows an electronic instrument according to this embodiment.

As electronic instruments having the semiconductor device land wiring board 10 of the embodiment of the present invention, FIG. 7 shows a notebook personal computer 100, and FIG. 8 shows a mobile telephone 200.

The electronic instrument according to this embodiment may have an electrooptic device (not shown in the drawings). The electrooptic device has the wiring board 10 electrically connected to a display panel (for example, a glass substrate). The electrooptic device is, for example, a liquid crystal device, a plasma display device, an electroluminescence display device, or the like, and has an electrooptic substance (liquid crystal, plasma, photo emitting material, or the like).

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A wiring board comprising:

a substrate;

a wiring pattern which is provided on the substrate and includes a land and a line connected to the land; and a protective film which has an opening and is provided over the substrate and the wiring pattern, wherein:
the land has a first portion which includes a connecting portion connected to the line and is covered by the protective film, and a second portion exposed by the opening; and
a hole is formed at least in the first portion of the land, to expose the substrate.

2. The wiring board as defined in claim 1, wherein:

at least part of an end portion of the protective film is located over the land; and the width of the land, at least in a portion over which the end portion of the protective film is located, is larger than the width of the line at the connecting portion connected to the land.

3. The wiring board as defined in claim 1, wherein the hole is formed only in the first portion.

4. The wiring board as defined in claim 1, wherein the hole is formed in the first and second portions.

5. The wiring board as defined in claim 4, wherein the hole is formed continuously from the first portion to the second portion.

6. The wiring board as defined in claim 1, wherein the hole is a slit extending toward the second portion.

7. The wiring board as defined in claim 1, wherein a plurality of the holes are formed.

8. The wiring board as defined in claim 7, wherein the holes are arranged in a direction parallel to a boundary between the first and second portions.

9. The wiring board as defined in claim 1, wherein a metal coating is formed on the second portion by plating.

10. The wiring board as defined in claim 9, wherein:

the wiring pattern is formed of at least copper; and the metal coating is formed of gold.

11. The wiring board as defined in claim 1, wherein the substrate is a flexible substrate.

12. An electronic component comprising:

a wiring board having: a substrate; a wiring pattern which is provided on the substrate and includes a land and a line connected to the land; and a protective film which has an opening and is provided over the substrate and the wiring pattern, wherein: the land has a first portion which includes a connecting portion connected to the line and is covered by the protective film, and a second portion exposed by the opening; and a hole is formed at least in the first portion of the land, to expose the substrate; and an electronic element having a terminal electrically connected to the second portion of the land, and mounted on the wiring board.

13. The electronic component as defined in claim 12, wherein:

the electronic element is a semiconductor chip; and the semiconductor chip has a bump as the terminal.

14. An electronic instrument comprising an electronic component which includes:

a wiring board having: a substrate; a wiring pattern which is provided on the substrate and includes a land and a line connected to the land; and a protective film which has an opening and is provided over the substrate and the wiring pattern, wherein: the land has a first portion which includes a connecting portion connected to the line and is covered by the protective film, and a second portion exposed by the opening; and a hole is formed at least in the first portion of the land, to expose the substrate; and an electronic element having a terminal electrically connected to the second portion of the land, and mounted on the wiring board.

* * * * *